(12) United States Patent
Shinozaki

(10) Patent No.: US 10,361,618 B2
(45) Date of Patent: Jul. 23, 2019

(54) DRIVING CIRCUIT FOR HIGH-SIDE TRANSISTOR

(71) Applicant: ROHM CO., LTD., Kyoto-shi, Kyoto (JP)

(72) Inventor: Yuichi Shinozaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/028,503

(22) Filed: Jul. 6, 2018

(65) Prior Publication Data

US 2019/0013725 A1 Jan. 10, 2019

(30) Foreign Application Priority Data

Jul. 7, 2017 (JP) ................. 2017-133900

(51) Int. Cl.
| | |
|---|---|
| *H03K 17/16* | (2006.01) |
| *H02M 1/08* | (2006.01) |
| *H02M 3/156* | (2006.01) |
| *H02H 7/12* | (2006.01) |
| *H02M 1/32* | (2007.01) |
| *H02M 3/158* | (2006.01) |

(Continued)

(52) U.S. Cl.
CPC ............. *H02M 1/08* (2013.01); *H02H 7/1213* (2013.01); *H02M 1/32* (2013.01); *H02M 3/156* (2013.01); *H02M 3/1588* (2013.01); *H03K 17/063* (2013.01); *H03K 17/0822* (2013.01); *H02M 2001/0003* (2013.01); *H03K 2217/0063* (2013.01); *H03K 2217/0081* (2013.01)

(58) Field of Classification Search
CPC ........ H02H 7/1213; H02M 1/08; H02M 1/32; H02M 3/156; H02M 2001/0003
See application file for complete search history.

(56) References Cited

U.S. PATENT DOCUMENTS

| | | | | | |
|---|---|---|---|---|---|
| 6,639,427 | B2 * | 10/2003 | Dray | ...................... | G11C 5/145 326/17 |
| 7,145,364 | B2 * | 12/2006 | Bhattacharya | ......... | H03K 3/012 326/68 |

(Continued)

FOREIGN PATENT DOCUMENTS

JP 2012070333 A 4/2012

*Primary Examiner* — Alexander H Taningco
*Assistant Examiner* — Kurtis R Bahr
(74) *Attorney, Agent, or Firm* — Cantor Colburn LLP

(57) ABSTRACT

A driving circuit drives an N-channel or NPN high-side transistor. A level shift circuit includes an open-drain differential conversion circuit that converts an input signal $S_{IN}$ into a differential signal $S_{diffP}/S_{diffN}$, and a latch circuit that switches its state according to the differential output $S_{diffP}/S_{diffN}$ of the differential conversion circuit. A driver drives a high-side transistor according to an output of the level shift circuit. A bootstrap circuit generates a bootstrap voltage $V_{BST}$ to be used as an upper-side power supply for the driver. Upon detecting an abnormal state, a protection circuit controls at least a part of the driving circuit except for the input signal $S_{IN}$ so as to turn off the high-side transistor.

12 Claims, 6 Drawing Sheets

(51) Int. Cl.
*H03K 17/06* (2006.01)
*H03K 17/082* (2006.01)
*H02M 1/00* (2006.01)

(56) References Cited

U.S. PATENT DOCUMENTS

| | | | | |
|---|---|---|---|---|
| 7,541,795 B1* | 6/2009 | Smith | ............... | H02M 1/32 |
| | | | | 323/283 |
| 8,823,425 B2* | 9/2014 | Heo | ............... | H03K 17/08122 |
| | | | | 327/108 |
| 2011/0080205 A1* | 4/2011 | Lee | ............... | H03K 17/0822 |
| | | | | 327/390 |
| 2012/0049829 A1* | 3/2012 | Murakami | ............... | H02M 1/32 |
| | | | | 323/288 |
| 2012/0075001 A1* | 3/2012 | Sumitomo | ............... | H03K 3/356165 |
| | | | | 327/333 |
| 2012/0212863 A1* | 8/2012 | Ando | ............... | H02H 7/222 |
| | | | | 361/45 |

* cited by examiner

440A

DRIVING CIRCUIT FOR HIGH-SIDE TRANSISTOR

CROSS REFERENCE TO RELATED APPLICATION

The present application claims priority under 35 U.S.C. § 119 to Japanese Application No. 2017-133900 filed Jul. 7, 2017, the entire content of which is incorporated herein by reference.

BACKGROUND OF THE INVENTION

1. Field of the Invention

The present invention relates to a driving circuit for a high-side transistor.

2. Description of the Related Art

Various kinds of electronic devices employ a DC/DC converter that converts a DC voltage having a given voltage value into a DC voltage having a different voltage value. FIG. 1 is a circuit diagram showing a step-down (buck) DC/DC converter. A DC/DC converter 100R receives a DC input voltage $V_{IN}$ via an input terminal 102, and generates an output voltage $V_{OUT}$ having a reduced voltage value at an output terminal 104. The DC/DC converter 100R includes an output circuit 110R and a control circuit 200R. The output circuit 110R mainly includes a switching transistor M1, an inductor L1, a rectifier diode D1, and an output capacitor C1. The output capacitor C1 is coupled to the output terminal 104. One end of the inductor L1 is coupled to a switching (LX) terminal of the control circuit 200R. The other end of the inductor L1 is coupled to the output terminal 104. The rectifier diode D1 is arranged such that its anode is grounded and its cathode is coupled to the LX terminal.

The switching transistor M1 is built into the control circuit 200R. A VCC terminal of the control circuit 200R is coupled to the input terminal 102. The DC input voltage $V_{IN}$ is supplied to the VCC terminal. The switching transistor (which will also be referred to as the "high-side transistor") M1 arranged on the high-voltage side is configured as an N-channel MOSFET (Metal Oxide Semiconductor Field Effect transistor), which is arranged such that its source is coupled to the LX terminal and its drain is coupled to the VCC terminal.

A detection terminal (VS) receives, as a feedback signal, a signal that indicates the state (current, voltage, electric power, or the like) of the DC/DC converter 100R or otherwise the state of a load (not shown) coupled to the output terminal 104. A pulse generator 202 generates a pulse signal S1 with a duty ratio, frequency, or otherwise a combination thereof that is changed such that the output state of the DC/DC converter 100R approaches a target state. For example, in a case in which the DC/DC converter 100R is configured as a constant voltage output DC/DC converter, the pulse generator 202 includes an error amplifier and a pulse modulator. In this case, the pulse generator 202 generates the pulse signal S1 such that the output voltage $V_{OUT}$ approaches a target voltage $V_{REF}$. In a case in which the DC/DC converter 100R is configured as a constant current output DC/DC converter, the pulse generator 202 generates the pulse signal S1 such that a current $I_{OUT}$ that flows through the load approaches a target value $I_{REF}$.

A driver 204 switches on and off the switching transistor M1 according to the pulse signal S1. In a case in which the switching transistor M1 is configured as an N-channel MOSFET as described above, in order to turn on the switching transistor M1, there is a need to apply a voltage that is higher than the voltage between its drain and source (i.e., input voltage $V_{IN}$) to the gate of the switching transistor M1. In order to supply such a voltage, a bootstrap circuit 210 is arranged. The bootstrap circuit 210 includes a bootstrap capacitor C2, a rectifier element 212, a transistor 214, and a bootstrap power supply circuit 220. The bootstrap capacitor C2 is arranged in the form of an external component between the LX terminal and a bootstrap (BST) terminal. The bootstrap power supply circuit 220 generates a constant voltage $V_{CCBST}$. The rectifier element 212 is arranged between the BST terminal and an output of the bootstrap power supply circuit 220. The transistor 214 is arranged between the LX terminal and the ground. The voltage $V_{BST}$ at the BST terminal is supplied to the upper-side power supply terminal of the driver 204.

During a period in which the switching transistor M1 is turned off, the transistor 214 is turned on, which grounds one end (LX-side end) of the bootstrap capacitor C2. In this state, the voltage $V_{CCBST}$ is applied to the other end (BST-side end) of the bootstrap capacitor C2 via the rectifier element 212. Accordingly, the bootstrap capacitor C2 is charged using the voltage across both ends thereof represented by ($V_{CCBST}-V_F$). Here, $V_F$ represents the forward voltage of the rectifier element 212. Such an arrangement is designed such that the relation $V_{CCBST}-V_F>V_{GS(TH)}$ holds true. Here, $V_{GS(TH)}$ represents a gate-source threshold voltage of the switching transistor M1.

In the turned-on period of the switching transistor M1, with the source voltage of the switching transistor M1 as $V_{LX}$, the voltage $V_{BST}$ at the BST terminal is represented by $V_{BST}=V_{LX}(V_{CCBST}-V_F)$. The driver 204 uses the voltage $V_{BST}$ as a high-level voltage to be applied to the gate of the switching transistor M1. In this period, the gate-source voltage $V_{GS}$ of the switching transistor M1 is represented by $V_{GS}=V_{BST}-V_{LX}=(V_{CCBST}-V_F)$. That is to say, the relation $V_{GS}>V_{GS(TH)}$ holds true. Thus, the switching transistor M1 is turned on.

The pulse signal S1 is designed with the power supply voltage $V_{CC}$ as the high level and with the ground voltage $V_{GND}$ as the low level. In contrast, the input signal S2 to be input to the driver 204 is designed with the voltage $V_{BST}$ as the high level and with $V_{LX}$ as the low level. Accordingly, a level shift circuit 203 is arranged between the pulse generator 202 and the driver 204. A level shift circuit employing a latch circuit has been disclosed in Patent document 1.

RELATED ART DOCUMENTS

Patent Documents

[Patent Document 1]
Japanese Patent Application Laid Open No. 2012-70333

When the DC/DC converter 100R suspends its operation, the pulse generator 202 fixedly sets the pulse signal S1 to a logical level (off level) that corresponds to the off state of the switching transistor M1. In a state in which the pulse signal S1 is set to such a logical level (off level) that corresponds to the off state of the switching transistor M1, the level shift circuit 203 is required to fixedly set the input signal S2 of the driver 204 to a level (off level) that corresponds to the off state of the switching transistor M1.

However, when a certain abnormal state such as disconnection or reduction of the power supply voltage $V_{CC}$ or the like has occurred, this arrangement has the potential to cause a problem in that the level shift circuit 230 is fixedly set to a state that corresponds to the on state of the switching transistor M1 even if the pulse signal S1 is set to the off level. It should be noted that this problem is by no means within the scope of general common understanding of those skilled in this art.

SUMMARY OF THE INVENTION

The present invention has been made in view of such a situation. Accordingly, it is an exemplary purpose of an embodiment of the present invention to provide a driving circuit that is capable of setting a high-side transistor to an off state when an abnormal state has occurred.

An embodiment of the present invention relates to a driving circuit for an N-channel or otherwise NPN high-side transistor. The driving circuit comprises: a level shift circuit comprising an open-drain differential conversion circuit structured to convert an input signal into a differential signal, and a latch circuit structured to transit according to a differential output of the differential conversion circuit; a driver structured to drive the high-side transistor according to an output of the level shift circuit; a bootstrap circuit structured to generate a bootstrap voltage to be used as an upper-side power supply for the driver; and a protection circuit structured to cause turn off of the high-side transistor upon detecting an abnormal state.

With this embodiment, when an abnormal state has occurred, the high-side transistor can be turned off in a sure manner without involving an unstable state.

Also, upon detecting an abnormal state, the protection circuit may control a differential input of the latch circuit so as to switch the latch circuit to a state that corresponds to the off state of the high-side transistor.

Also, the protection circuit may comprise a first transistor arranged between one terminal of the differential input of the latch circuit and the ground. Also, upon detecting an abnormal state, the protection circuit may turn on the first transistor.

Also, upon detecting an abnormal state, the protection circuit may lower the bootstrap voltage. In a case in which the bootstrap voltage is lowered, this arrangement reduces the output voltage of the driver, i.e., reduces the gate-source voltage of the high-side transistor, thereby allowing the high-side transistor to be turned off.

Also, upon detecting an abnormal state, the protection circuit may discharge a bootstrap capacitor of the bootstrap circuit.

Also, the protection circuit comprises a discharge transistor arranged between a bootstrap line at which the bootstrap voltage is generated and a ground line. Also, upon detecting an abnormal state, the protection circuit may turn on the discharge transistor.

Also, upon detecting an abnormal state, the protection circuit may pull down a control terminal of the high-side transistor. This allows the high-side transistor to be directly and forcibly turned off.

Also, when a power supply voltage for the differential conversion circuit becomes lower than a predetermined threshold value, the protection circuit may judge that an abnormal state has occurred. If the power supply voltage for the differential conversion circuit falls, both terminals of the differential output of the differential conversion circuit become the low-level state. In some cases, this leads to an unstable state of the level shift circuit. In order to solve this problem, by monitoring the power supply voltage, and by providing a path for controlling the off state of the switching transistor independently of the differential conversion circuit, this arrangement allows the switching transistor to be turned off in a sure manner.

Also, the protection circuit may be structured to employ, as a power supply thereof, a separate DC voltage system that differs from that of the power supply voltage. This allows the operation of the protection circuit to be maintained even if the power supply voltage falls.

Also, the protection circuit may comprise: a second transistor arranged such that one end is grounded, and the DC voltage is supplied to the other end via a resistor; and a voltage dividing circuit structured to divide the power supply voltage, and to supply the voltage thus divided to a control terminal of the second transistor. The on/off state of the second transistor may indicate a detection result of the abnormal state.

Also, the DC voltage may be configured as the bootstrap voltage. Also, the DC voltage may be configured as an input voltage to be supplied to a drain of the high-side transistor. Also, the DC voltage may be configured as a voltage to be supplied to the bootstrap circuit.

When both components of the differential output of the differential conversion circuit each become a low-level state, the protection circuit may judge that an abnormal state has occurred.

Another embodiment of the present invention relates to a control circuit for a DC/DC converter. The control circuit comprises: a pulse generator structured to generate a pulse signal such that the DC/DC converter or otherwise a load thereof approaches a desired state; and any one of the driving circuits each structured to receive an output of the pulse generator as an input thereof, and to drive a high-side transistor.

Also, the control circuit may monolithically be integrated on a single semiconductor substrate. Examples of such an "integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants. By integrating the circuit on a single chip, such an arrangement allows the circuit area to be reduced, and allows the circuit elements to have uniform characteristics.

Yet another embodiment of the present invention relates to a DC/DC converter. The DC/DC converter may comprise the control circuit described above.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not affect the electric connection therebetween, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not affect the electric connection therebetween, in addition to a state in which they are directly coupled.

Also, the phrase "a signal A (voltage or current) corresponds to a signal B (voltage or current)" means the state in which the signal A has a correlation with the signal B. Specific examples of such a state include: (i) a state in which the signal A is the same as the signal B; (ii) a state in which the signal A is proportional to the signal B; (iii) a state in which the signal A is obtained by shifting the level of the signal B; (iv) a state in which the signal A is obtained by amplifying the signal B; (v) a state in which the signal A is obtained by inverting the signal B; (vi) a desired combination of the aforementioned states (i) through (v); and the like. The range of "corresponds" as described above is determined by the kinds of the signals A and B and the usage of the signals A and B, which can clearly be understood by those skilled in this art.

Figure 2:
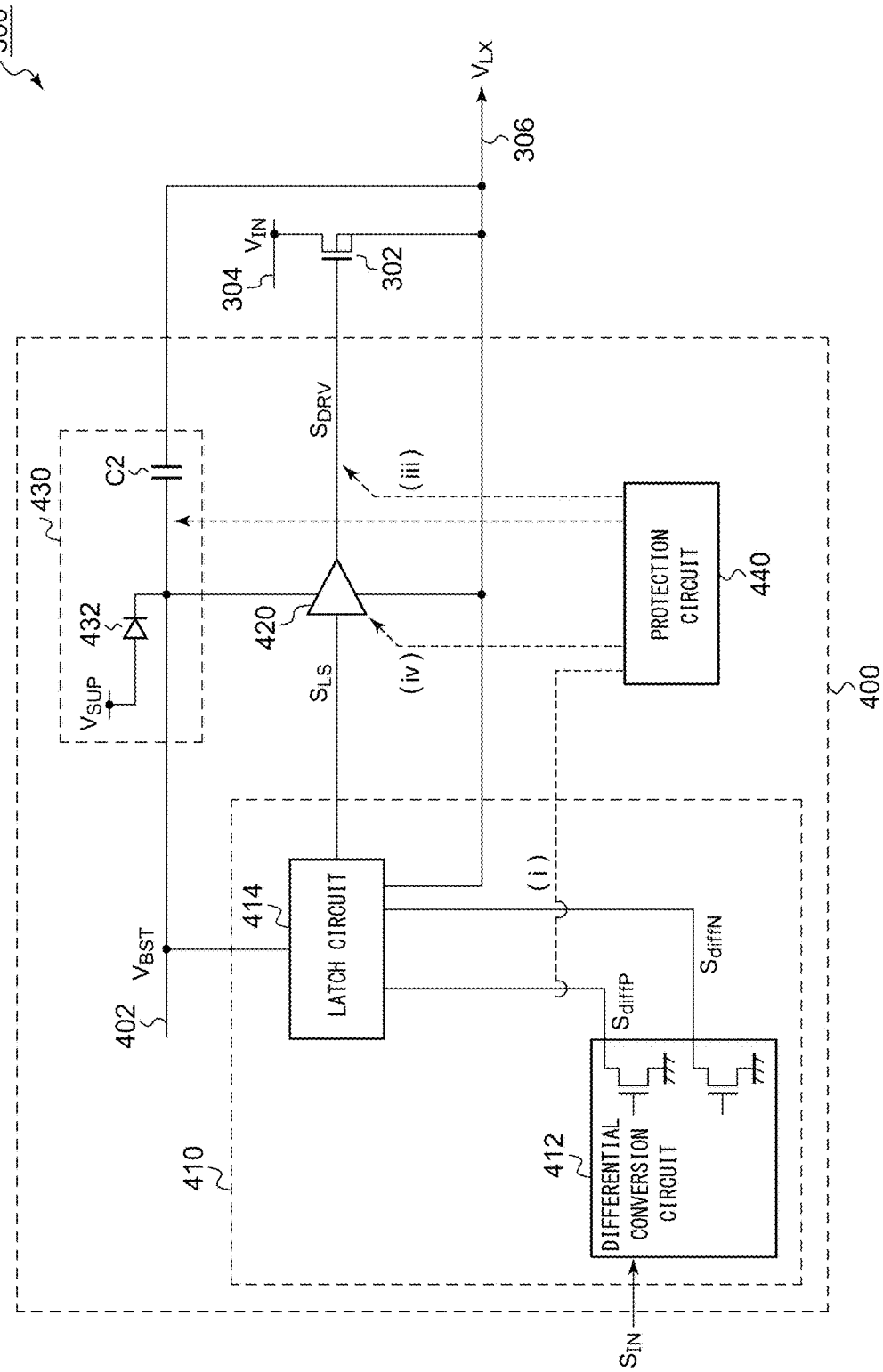
FIG. 2 is a circuit diagram showing a switching circuit including a driving circuit according to an embodiment.

FIG. 2 is a circuit diagram showing a switching circuit 300 including a driving circuit 400 according to an embodiment. The switching circuit 300 includes a high-side transistor 302 and the driving circuit 400. The high-side transistor 302 is configured as an N-channel MOSFET arranged such that its drain is coupled to an input line 304 and its source is coupled to an output line 306.

The driving circuit 400 drives the high-side transistor 302 according to an input signal $S_{IN}$ that indicates an on/off state of the high-side transistor 302. For example, the high level of the input signal $S_{IN}$ is designed as an on level that indicates the on state of the high-side transistor 302. The low level thereof is designed as an off level that indicates the off state of the high-side transistor 302. The electrical state of the output line 306 changes according to the input signal $S_{IN}$. The voltage at the output line 306 will be referred to as the "switching voltage $V_{LX}$".

The switching circuit 300 may include a low-side transistor arranged between the output line 306 and a ground line and a driving circuit thereof, in addition to the high-side transistor 302.

The driving circuit 400 includes a level shift circuit 410, a driver 420, a bootstrap circuit 430, and a protection circuit 440.

The level shift circuit 410 includes a differential conversion circuit 412 and a latch circuit 414. The differential conversion circuit 412 includes an open-drain output (including an open-collector output). The differential conversion circuit 412 converts an input signal $S_{IN}$ into a differential signal $S_{diffP}$ and $S_{diffN}$.

The latch circuit 414 switches its state with the differential output $S_{diffP}$ and $S_{diffN}$ of the differential conversion circuit 412. For example, the latch circuit 414 is configured such that it transits to a first state according to an assertion of the differential output $S_{diffP}$, and such that it transits to a second state according to an assertion of the differential output $S_{diffN}$.

The latch circuit 414 receives the supply of the bootstrap voltage $V_{BST}$ and the switching voltage $V_{LX}$. The output signal $S_{LS}$ of the latch circuit 414 is level shifted. In the first state, the output signal $S_{LS}$ is set to one from among the bootstrap voltage $V_{BST}$ and the switching voltage $V_{LX}$. In the second state, the output signal $S_{LS}$ is set to the other one from among the bootstrap voltage $V_{BST}$ and the switching voltage $V_{LX}$.

For clarification, description will be made regarding an arrangement in which the first state corresponds to the on state of the high-side transistor 302 and the second state corresponds to the off state of the high-side transistor 302. Furthermore, description will be made assuming that, in the first state, the output $S_{LS}$ of the latch circuit 414 is set to the bootstrap voltage $V_{BST}$, and in the second state, the output $S_{LS}$ is set to the switching voltage $V_{LX}$.

Furthermore, the driver 420 receives the supply of the bootstrap voltage $V_{BST}$ and the switching voltage $V_{LX}$. The driver 420 applies a driving signal $S_{DRV}$ to a control terminal (gate or otherwise base) of the high-side transistor 302 according to the output $S_{LS}$ of the level shift circuit 410. The driving signal $S_{DRV}$ is switched between the bootstrap voltage $V_{BST}$ that corresponds to the high level and the switching voltage $V_{LX}$ that corresponds to the low level.

The bootstrap circuit 430 generates the bootstrap voltage $V_{BST}$ configured as an upper-side power supply for the driver 420. The bootstrap circuit 430 includes a bootstrap capacitor C2 and a rectifier element 432. One end of the bootstrap capacitor C2 is coupled to the output line 306. A DC voltage $V_{SUP}$ is supplied to the other end of the bootstrap capacitor C2 via the rectifier element 432. The bootstrap voltage $V_{BST}$ is represented by the following Expression. The switching voltage $V_{LX}$ switches on and off according to the input voltage $S_{IN}$. Accordingly, the bootstrap voltage $V_{BST}$ also switches on and off according to the input signal $S_{IN}$.

$$V_{BST} = V_{LX} + V_{SUP} - V_F$$

Here, $V_F$ represents a forward voltage (voltage drop) that occurs across the rectifier element 432. The line at which the bootstrap voltage $V_{BST}$ is generated will be referred to as the "bootstrap line 402".

Upon detecting an abnormal state, the protection circuit 440 acts upon at least a part of the driving circuit 400 except for the input signal $S_{IN}$, so as to turn off the high-side transistor 302.

In an example, the protection circuit 440 controls the differential input of the latch circuit 414 (differential output of the differential conversion circuit 412) $S_{diffP}$ and $S_{diffN}$ as indicated by (i). Specifically, upon detecting an abnormal state, the protection circuit 440 may preferably control the differential signal $S_{diffP}$ and $S_{diffN}$ such that the latch circuit 414 is set to the second state. This allows the high-side transistor 302 to be forcibly turned off. This operation will be described later in a first example.

In an example, as indicated by (ii), the protection circuit 440 lowers the bootstrap voltage $V_{BST}$. This allows the high-side transistor 302 to be forcibly turned off. This operation will be described later in a second example.

In an example, as indicated by (iii), the protection circuit 440 may directly control the control terminal of the high-side transistor 302 so as to forcibly turn off the high-side transistor 302.

In an example, as indicated by (iv), the protection circuit 440 may control the driver 420 so as to set the driving signal $S_{DRV}$ to the low level.

It should be noted that the protection circuit 440 may control several components from among the aforementioned multiple circuit blocks at the same time or otherwise at intervals of time. The kind of such an abnormal state to be detected by the protection circuit 440 is not restricted in particular. Examples of such abnormal states include an abnormal low voltage, abnormal overvoltage, etc.

The above is the basic configuration of the driving circuit 400. The present invention encompasses various kinds of apparatuses and circuits that can be regarded as a block configuration or a circuit configuration shown in FIG. 2, or otherwise that can be derived from the aforementioned description. That is to say, the present invention is not restricted to a specific configuration. Description will be made below regarding more specific example configurations and modifications for clarification and ease of understanding of the essence of the present invention and the circuit operation. That is to say, the following description will by no means be intended to restrict the technical scope of the present invention.

First Example

Figure 3:
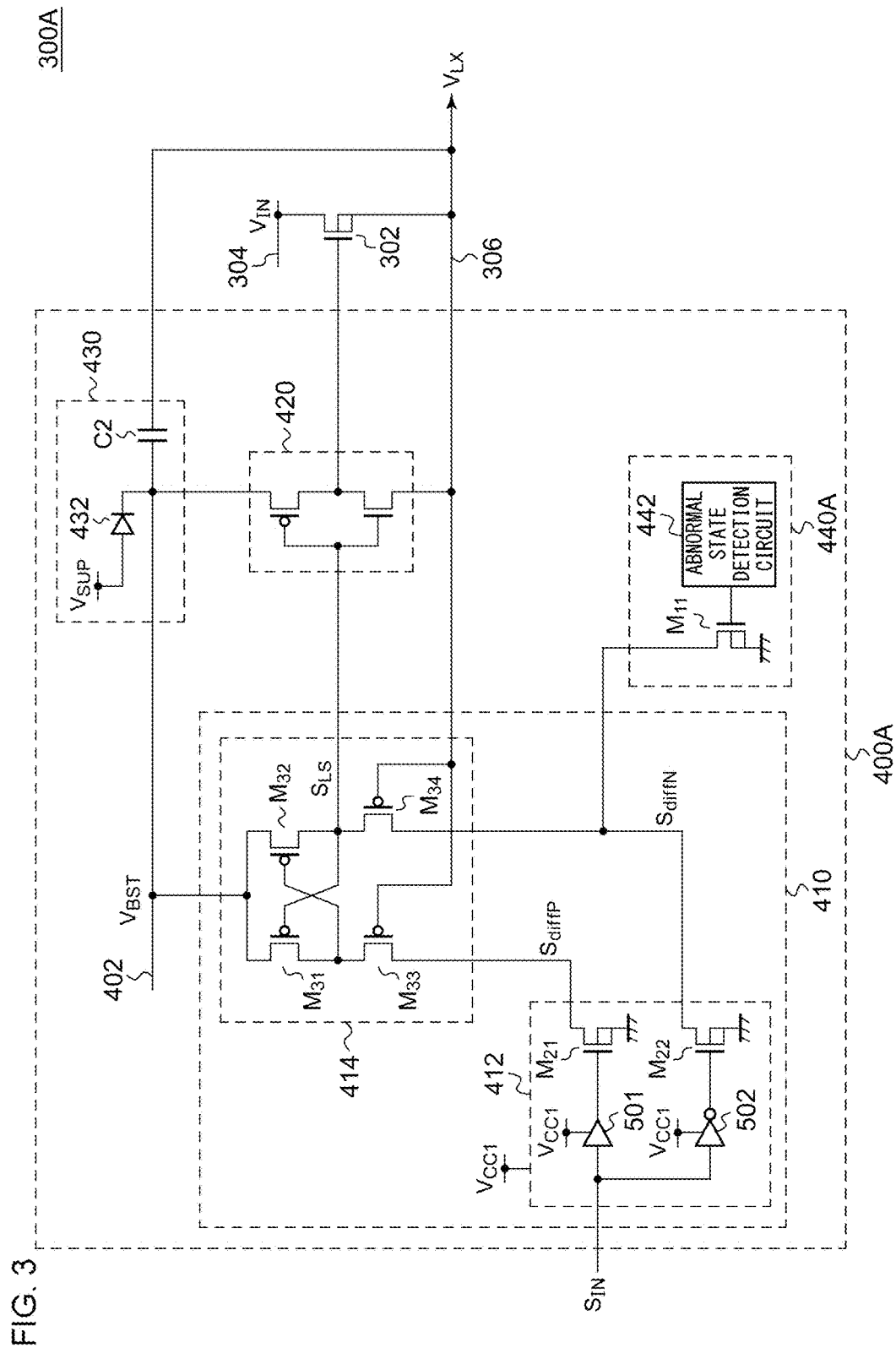
FIG. 3 is a circuit diagram showing a driving circuit according to a first example.

FIG. 3 is a circuit diagram showing a driving circuit 400A according to a first example. With the driving circuit 400A, a protection circuit 440A controls the differential input of the latch circuit 414 (differential output of the differential conversion circuit 412) $S_{diffP}$ and $S_{diffN}$.

The differential conversion circuit 412 includes a non-inverting buffer 501, an inverting buffer (inverter) 502, and transistors M21 and M22 that form an open-drain output stage. When the input signal $S_{IN}$ is set to the high level, the transistor M21 is turned on, and the transistor M22 is turned off. In this state, the one side of the differential signal $S_{diffP}$ is set to the low level, and the other side $S_{diffN}$ is set to the high-impedance state. Conversely, when the input signal $S_{IN}$ is set to the low level, the transistor M21 is turned off, and the transistor M22 is turned on. In this state, the one side of the differential signal $S_{diffP}$ is set to the high-impedance state, and the other side $S_{diffN}$ is set to the low level. In this example the low level corresponds to assertion.

The latch circuit 414 includes transistors M31 through M34 each configured as a P-channel MOSFET. The transistors M31 and M32 are cross-coupled such that the gate of one transistor is coupled to the drain of the other transistor. The switching voltage $V_{LX}$ is supplied to the gates of the transistors M33 and M34. When the one differential input $S_{diffP}$ is asserted (set to the low level), the latch circuit 414 is set to the first state (the output $S_{LS}$ is set to the high level=$V_{BST}$). Conversely, when the other differential input $S_{diffN}$ is asserted (set to the low level), the latch circuit 414 is set to the second state (the output $S_{LS}$ is set to the low level=$V_{LX}$). It should be noted that the configuration of the latch circuit 414 is not restricted in particular. Also, the latch circuit 414 may be configured as a known SR flip-flop or bistable multivibrator.

The driver 420 is configured as a CMOS inverter arranged between the bootstrap line 402 and the output line 306. The driver 420 includes a transistor M41 configured as a P-channel MOSFET and a transistor M42 configured as an N-channel MOSFET. The output $S_{DRV}$ of the driver 420 is supplied to the gate of the high-side transistor 302.

It should be noted that the configurations of the differential conversion circuit 412, the latch circuit 414, and the driver 420 are not restricted in particular.

Upon detecting an abnormal state, the protection circuit 440A controls the differential input of the latch circuit 414 (differential output of the differential conversion circuit 412) so as to supply a trigger that instructs the latch circuit 414 to transit to the second state that corresponds to the off state of the high-side transistor 302.

The protection circuit 440A includes an abnormal state detection circuit 442 and a first transistor $M_{11}$. The first transistor $M_{11}$ is arranged between one terminal ($S_{diffN}$) of the differential input of the latch circuit 414 and the ground. Upon detecting an abnormal state in which the circuit is to be protected, the abnormal state detection circuit 442 turns on the first transistor $M_{11}$.

The above is the configuration of the driving circuit 400A. Next, description will be made regarding the operation thereof. When the switching circuit 300A operates normally, the off state of the first transistor $M_{11}$ is maintained. The high-side transistor 302 repeatedly switches between the turn-on and turn-off states according to the transition of the input signal $S_{IN}$.

When an abnormal state has occurred in the switching circuit 300A, in some cases, the state of the latch circuit 414 becomes indefinite. Alternatively, in some cases, the latch circuit 414 is fixed to the first state. Examples of such a situation include: (i) a case in which the input signal $S_{IN}$ is in the high-level state at a timing at which an abnormal state has occurred; and (ii) a case in which the differential conversion circuit 412 cannot operate normally, and accordingly, the differential output $S_{diffN}$ cannot be asserted even if the input signal $S_{IN}$ is set to the low-level state.

With the driving circuit 400A shown in FIG. 3, when an abnormal state has occurred, the first transistor $M_{11}$ is turned on, and accordingly, the differential input $S_{diffN}$ of the latch circuit 414 is asserted. Accordingly, the latch circuit 414 can be forcibly switched to the second state. This prevents the switching circuit 300A from suspending its operation in a state in which the high-side transistor 302 is in the on state.

Next, description will be made regarding an abnormal state to be detected by the abnormal state detection circuit 442. As described above, if a situation in which the differential output $S_{diffN}$ cannot be asserted has occurred, the high-side transistor 302 remains on, which is a problem. Accordingly, the protection circuit 440A may judge that a state in which the differential conversion circuit 412 cannot operate normally is an abnormal state. Examples of such a state in which the differential conversion circuit 412 cannot operate normally includes a state in which the power supply voltage $V_{CC1}$ supplied to the differential conversion circuit 412 falls. When the power supply voltage $V_{CC1}$ becomes lower than a predetermined threshold value $V_{TH}$, the abnormal state detection circuit 442 may turn on the first transistor $M_{11}$.

It should be noted that the abnormal state detection circuit 442 is required to operate normally even when the power supply voltage $V_{CC}$ falls. From this viewpoint, the power supply voltage to be supplied to the protection circuit 440A (abnormal state detection circuit 442) is preferably configured as a separate system that differs from that of the power supply voltage to be supplied to the differential conversion circuit 412.

Figure 4:
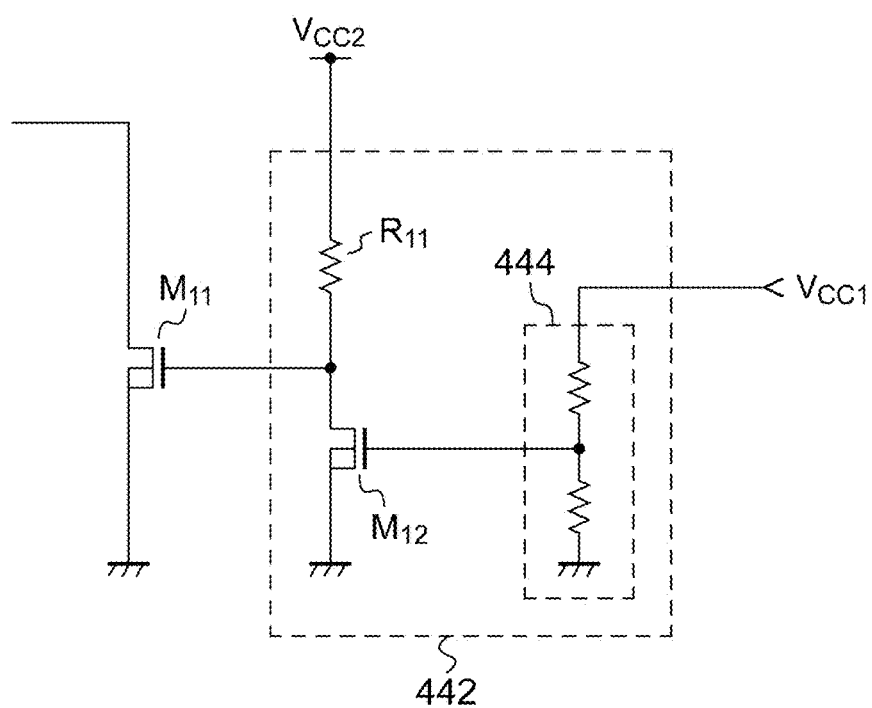
FIG. 4 is a circuit diagram showing an example configuration of a protection circuit.

FIG. 4 is a circuit diagram showing an example configuration of the protection circuit 440A. The abnormal state detection circuit 442 includes a voltage dividing circuit 444, a second transistor $M_{12}$, and a resistor $R_{11}$. The second transistor $M_{12}$ is arranged such that one end is grounded, and a DC voltage $V_{CC2}$ is supplied to the other end via the resistor $R_{11}$. The DC voltage $V_{CC2}$ is configured as a voltage supplied from a separate power supply system that differs from that of the power supply voltage $V_{CC1}$. As the DC voltage $V_{CC2}$, the power supply voltage $V_{SUP}$ for the bootstrap circuit, the input voltage $V_{IN}$ to be supplied to the drain of the high-side transistor 302, the bootstrap voltage $V_{BST}$, or the like, may be employed.

The voltage dividing circuit 444 divides the power supply voltage $V_{CC1}$ to be monitored, and supplies the divided voltage to a control terminal (gate) of the second transistor $M_{12}$. When the voltage $V_{CC1}'$ thus divided is higher than the gate-source threshold value of the second transistor $M_{12}$, the second transistor $M_{12}$ is set to the on level, and accordingly, the first transistor Mu is set to the off level (normal state). That is to say, the on/off level of the second transistor $M_{12}$ indicates the presence or absence of an abnormal state. When the voltage $V_{CC1}'$ thus divided becomes lower than the gate-source threshold value of the second transistor $M_{12}$, the second transistor $M_{12}$ is turned off, and the first transistor $M_{11}$ is turned on (abnormal state).

With this configuration, when the power supply voltage $V_{CC1}$ of the differential conversion circuit 412 falls, the high-side transistor 302 can be turned off in a sure manner. It should be noted that the configuration of the abnormal state detection circuit 442 is not restricted in particular. Also, a voltage comparator may be employed instead of the second transistor $M_{12}$.

Second Example

Figure 5:
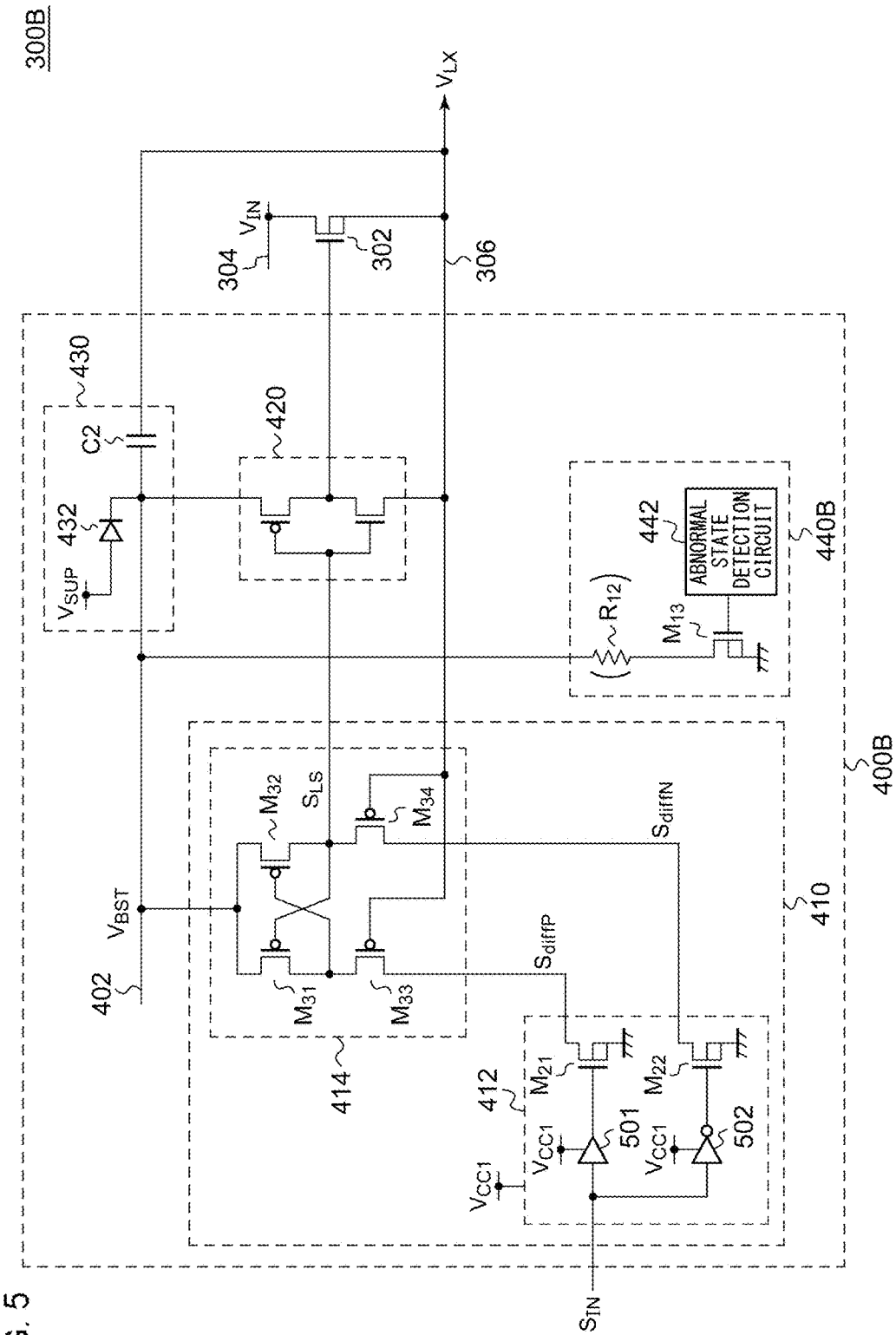
FIG. 5 is a circuit diagram showing a driving circuit according to a second example.

FIG. 5 is a circuit diagram showing a driving circuit 400B according to a second example. With the driving circuit 400B, when an abnormal state has occurred, a protection circuit 440B lowers the bootstrap voltage $V_{BST}$. Specifically, the protection circuit 440B is configured such that, upon detecting an abnormal state, the protection circuit 440B discharges the bootstrap capacitor C2 of the bootstrap circuit 430. The protection circuit 440B includes a discharge transistor $M_{13}$ and an abnormal state detection circuit 442. The discharge transistor $M_{13}$ is arranged between the bootstrap line 402 and the ground line. Upon detecting an abnormal state, the abnormal state detection circuit 442 turns on the discharge transistor $M_{13}$. It should be noted that, in order to adjust the discharging rate to be provided by the protection circuit 440B, a discharge resistor $R_{12}$ may be inserted. In the second example, the abnormal state detection circuit 442 may have the same configuration as that shown in FIG. 4.

When the bootstrap voltage $V_{BST}$ falls, the output voltage $S_{DRV}$ of the driver 420 is reduced, i.e., the gate-source voltage of the high-side transistor 302 is reduced, thereby allowing the high-side transistor 302 to be turned off.

The discharge transistor $M_{13}$ may be arranged between both ends of the bootstrap capacitor C2, i.e., between the bootstrap line 402 and the output line 306. When the discharge transistor $M_{13}$ is turned on, this reduces a voltage across both ends of the bootstrap capacitor C2, thereby allowing the bootstrap voltage $V_{BST}$ to be reduced.

Usage

Figure 1:
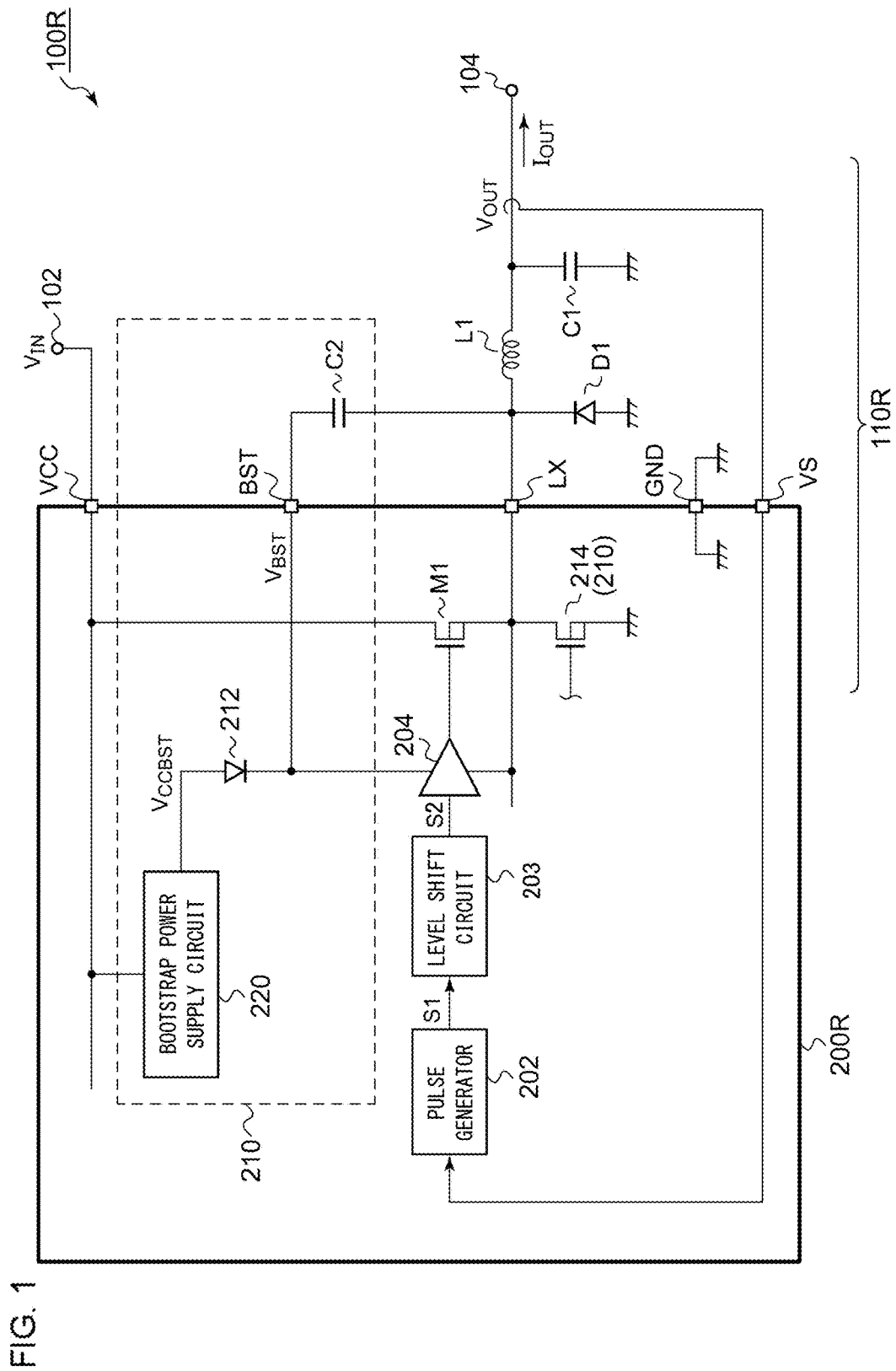
FIG. 1 is a circuit diagram showing a step-down (buck) DC/DC converter.
Figure 6:
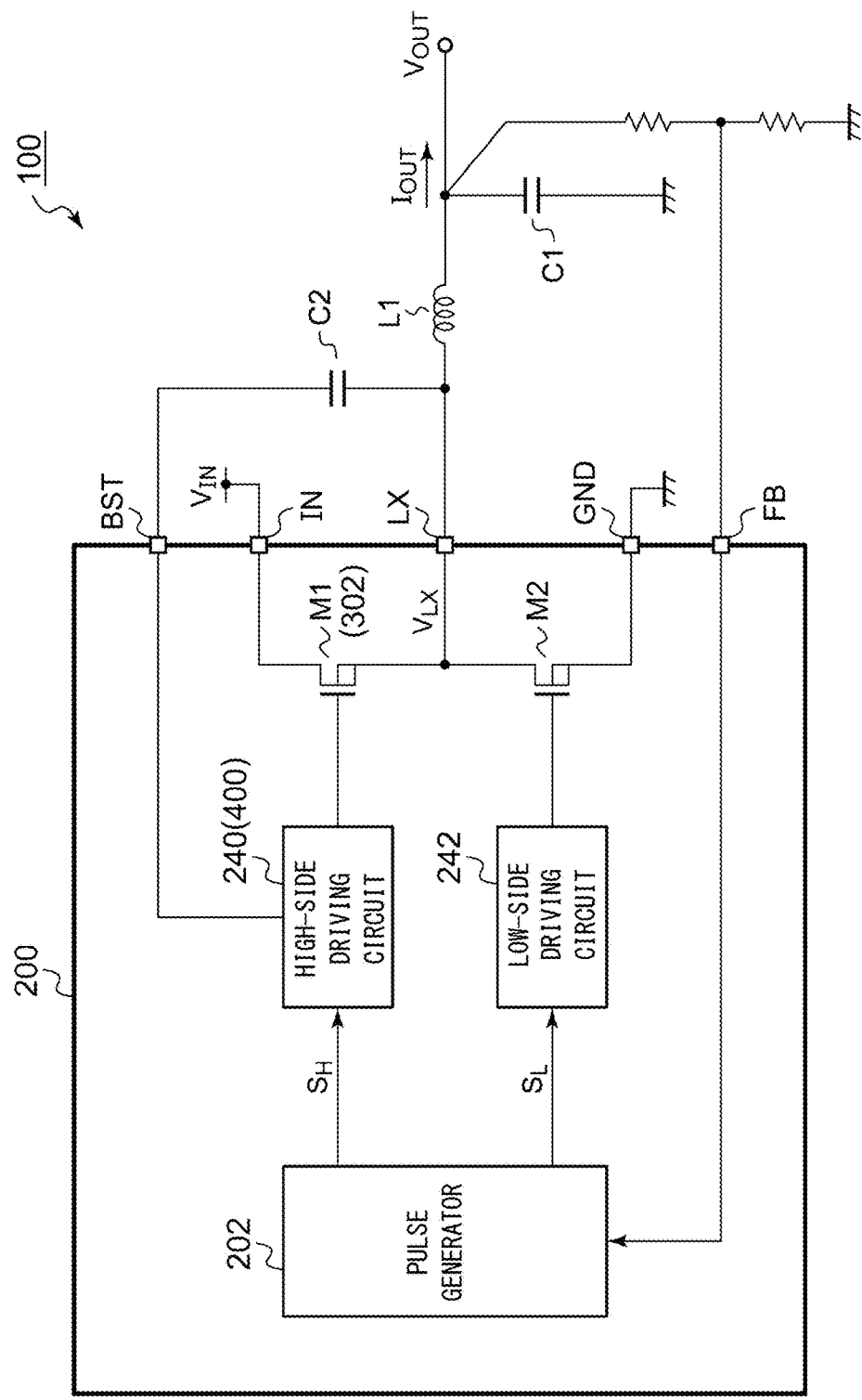
FIG. 6 is a circuit diagram showing a DC/DC converter including a switching circuit.

Next, description will be made regarding the usage of the driving circuit 400. FIG. 6 is a circuit diagram showing a DC/DC converter 100 including a switching circuit 300. The DC/DC converter 100 has the same basic configuration as that described above with reference to FIG. 1. A control circuit 200 is configured as a function IC integrated on a single semiconductor substrate. A pulse generator 202 generates a high-side pulse $S_H$ and a low-side pulse $S_L$ such that the state of a load or otherwise the DC/DC converter 100 approaches a target value. For example, the pulse generator 202 may control the output voltage $V_{OUT}$ such that it approaches a target voltage $V_{REF}$ (constant voltage control operation). Also, the pulse generator 202 may control an output current $I_{OUT}$ such that it approaches a target current $I_{REF}$ (constant current control operation).

A high-side driving circuit 240 drives a switching transistor M1 according to a high-side pulse $S_H$. A low-side driving circuit 242 drives a synchronous rectification transistor M2 according to a low-side pulse $S_L$.

In the DC/DC converter 100, the switching transistor M1 corresponds to the high-side transistor 302, and the high-side driving circuit 240 corresponds to the driving circuit 400. The high-side transistor M1 and the low-side transistor M2 may each be configured as a discrete element externally coupled to the control circuit 200. The control circuit 200 may include an unshown built-in power supply for the bootstrap circuit. Alternatively, the power supply voltage Vsup for a bootstrap circuit may be supplied from an external circuit.

Description has been made above regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

First Modification

Description has been made in the embodiment regarding an arrangement in which the high-side transistor 302 is configured as an N-channel MOSFET. Also, the high-side transistor 302 may be configured as an NPN bipolar transistor or otherwise an IGBT. In this case, the gate, source, and drain correspond to the base, emitter, and drain, respectively.

Second Modification

Description has been made in the embodiment regarding an arrangement in which the protection circuit 440 detects a state in which the voltage falls as an abnormal state (low-voltage abnormal state). However, the present invention is not restricted to such an arrangement. Also, when an overvoltage abnormal state or an overcurrent abnormal state has occurred, the protection circuit 440 may protect the circuit.

Third Modification

In the DC/DC converter 100 shown in FIG. 6, the synchronous rectification transistor M2 may be replaced by a diode. Also, the topology of the DC/DC converter 100 is not restricted to that of a step-down DC/DC converter. Also, the DC/DC converter 100 may have other topologies including a high-side transistor.

Fourth Modification

The usage of the switching circuit 300 is not restricted to a DC/DC converter. For example, the switching circuit 300 may be applied to a bi-directional converter, a charger circuit for a battery, an inverter apparatus for driving a motor, and a class D audio amplifier.

Description has been made regarding the present invention with reference to the embodiments using specific terms. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A driving circuit for an N-channel or otherwise NPN high-side transistor, the driving circuit comprising:
   a level shift circuit comprising an open-drain differential conversion circuit structured to convert an input signal into a differential signal, and a latch circuit structured to transit according to a differential output of the differential conversion circuit;
   a driver structured to drive the high-side transistor according to an output of the level shift circuit;
   a bootstrap circuit structured to generate a bootstrap voltage to be used as an upper-side power supply for the driver; and
   a protection circuit structured to cause turn off of the high-side transistor in an abnormal state,
   wherein the protection circuit is structured to lower the bootstrap voltage in the abnormal state, and wherein the protection circuit comprises a discharge transistor arranged between a bootstrap line at which the bootstrap voltage is generated and a ground line,
   wherein the protection circuit is structured to turn on the discharge transistor in the abnormal state.

2. The driving circuit according to claim 1, wherein the protection circuit is structured to discharge a bootstrap capacitor of the bootstrap circuit in the abnormal state.

3. The driving circuit according to claim 1, wherein the protection circuit is structured to pull down a voltage of a control terminal of the high-side transistor in the abnormal state.

4. The driving circuit according to claim 1, wherein, when a power supply voltage for the differential conversion circuit becomes lower than a predetermined threshold value, the protection circuit judges that the abnormal state has occurred.

5. The driving circuit according to claim 4, wherein the protection circuit is structured to employ, as a power supply thereof, a separate DC voltage system that differs from that of the power supply voltage.

6. A driving circuit for an N-channel or otherwise NPN high-side transistor, the driving circuit comprising:
   a level shift circuit comprising an open-drain differential conversion circuit structured to convert an input signal into a differential signal, and a latch circuit structured to transit according to a differential output of the differential conversion circuit;
   a driver structured to drive the high-side transistor according to an output of the level shift circuit;
   a bootstrap circuit structured to generate a bootstrap voltage to be used as an upper-side power supply for the driver; and
   a protection circuit structured to cause turn off of the high-side transistor in an abnormal state,
   wherein, when a power supply voltage for the differential conversion circuit becomes lower than a predetermined threshold value, the protection circuit judges that the abnormal state has occurred,
   and wherein the protection circuit is structured to employ, as a power supply thereof, a separate DC voltage system that differs from that of the power supply voltage,
   wherein the protection circuit comprises:
   a second transistor having one end being grounded, and an other end to which DC voltage is supplied to via a resistor; and
   a voltage dividing circuit structured to divide the power supply voltage, and to supply the divided voltage to a control terminal of the second transistor,
   wherein an on/off state of the second transistor indicates a detection result of the abnormal state.

7. The driving circuit according to claim 6, wherein the DC voltage is configured as the bootstrap voltage.

8. The driving circuit according to claim 6, wherein the DC voltage is configured as an input voltage to be supplied to a drain of the high-side transistor.

9. The driving circuit according to claim 6, wherein the DC voltage is configured as a voltage to be supplied to the bootstrap circuit.

10. A control circuit for a DC/DC converter, comprising:
    a pulse generator structured to generate a pulse signal such that the DC/DC converter or otherwise a load thereof approaches a desired state; and
    the driving circuit according to claim 1, structured to receive an output of the pulse generator as an input thereof, and to drive a high-side transistor.

11. The control circuit according to claim 10, monolithically integrated on a single semiconductor substrate.

12. A DC/DC converter comprising the control circuit according to claim 10.

* * * * *